(12) United States Patent
Sutardja et al.

(10) Patent No.: US 7,863,709 B1
(45) Date of Patent: Jan. 4, 2011

(54) LOW BASE RESISTANCE BIPOLAR JUNCTION TRANSISTOR ARRAY

(75) Inventors: Pantas Sutardja, Los Gatos, CA (US); Albert Wu, Palo Alto, CA (US); Runzi Chang, San Jose, CA (US); Chien-Chuan Wei, Sunnyvale, CA (US); Winston Lee, Palo Alto, CA (US); Peter Lee, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 182 days.

(21) Appl. No.: 12/104,254

(22) Filed: Apr. 16, 2008

Related U.S. Application Data

(60) Provisional application No. 60/912,046, filed on Apr. 16, 2007, provisional application No. 60/913,924, filed on Apr. 25, 2007, provisional application No. 60/938,331, filed on May 16, 2007.

(51) Int. Cl.
*H01L 27/082* (2006.01)

(52) U.S. Cl. ........................ 257/586; 257/587; 257/588; 257/E27.055

(58) Field of Classification Search ................. 257/586, 257/587, 588, E27.055
See application file for complete search history.

(56) References Cited

U.S. PATENT DOCUMENTS

| | | | | |
|---|---|---|---|---|
| 4,339,767 A | * | 7/1982 | Horng et al. | 257/588 |
| 4,378,630 A | * | 4/1983 | Horng et al. | 438/327 |
| 4,381,953 A | * | 5/1983 | Ho et al. | 438/359 |
| 4,392,149 A | * | 7/1983 | Horng et al. | 257/518 |
| 4,446,476 A | * | 5/1984 | Isaac et al. | 257/770 |
| 4,519,128 A | * | 5/1985 | Chesebro et al. | 438/433 |
| 4,541,168 A | * | 9/1985 | Galie et al. | 438/653 |
| 5,747,846 A | * | 5/1998 | Iida et al. | 257/314 |

\* cited by examiner

*Primary Examiner*—Victor A Mandala

(57) ABSTRACT

Methods and apparatuses directed to low base resistance bipolar junction transistor (BJT) devices are described herein. A low base resistance BJT device may include a collector layer, a base layer formed on the collector layer, a plurality of isolation trench lines formed in the base layer and extending into the collector layer, and a plurality of polysilicon lines formed on the base layer parallel to and overlapping the plurality of isolation trench lines. The base layer may be N-doped or P-doped.

15 Claims, 15 Drawing Sheets

LOW BASE RESISTANCE BIPOLAR JUNCTION TRANSISTOR ARRAY

CROSS-REFERENCE TO RELATED APPLICATIONS

The present application claims priority to U.S. Provisional Patent Application Nos. 60/912,046, filed Apr. 17, 2007, 60/938,331, filed May 16, 2007, and 60/913,924, filed Apr. 25, 2007, the entire disclosures of which are hereby incorporated by reference in their entirety.

TECHNICAL FIELD

Embodiments of the present invention relate to the field of microelectronics, in particular, to devices including bipolar junction transistor arrays.

BACKGROUND

Bipolar junction transistors (BJT) arrays may be used for various applications including, for example, memory devices. Some BJT arrays are known to use the intrinsic base region as the conducting layer. Unfortunately, this may mean that the base parasitic resistance is undesirably high. Decreasing base resistance by increasing doping dosage to the base may not be a suitable solution for the high resistance at least in part due to a detrimental effect on current gain, beta.

SUMMARY

In view of the problems in the state of the art, embodiments of the invention are directed to low base resistance BJT arrays. More specifically, with the foregoing and other items in view, there is provided, in accordance with various embodiments of the invention, an apparatus comprising a collector layer, a base layer formed on the collector layer, a plurality of isolation trench lines formed in the base layer and extending into the collector layer, and a plurality of polysilicon lines formed on the base layer parallel to and overlapping the plurality of isolation trench lines.

In various embodiments, a doped material may be formed in at least one of the isolation trench lines, the doped material electrically connecting the base layer and at least one of the polysilicon lines. In various embodiments, the doped material may be an N-type material.

In various embodiments, a plurality of emitter fingers may be formed on the base layer. In some embodiments, a silicide layer may be formed on one or more of the emitter fingers. In some embodiments, at least one of the emitter fingers may be physically isolated from at least one of the polysilicon lines by a sidewall oxide layer.

In various embodiments, at least one of the plurality of emitter fingers may be formed on a portion of one of the plurality of polysilicon lines.

In various embodiments, at least one of the emitter fingers may be recessed into the base layer.

In various embodiments, the plurality of isolation trench lines may comprise an oxide material. In various embodiments, a silicide layer may be formed on one or more of the polysilicon lines.

In various embodiments, the collector layer may be a P-type collector layer, the base layer may be an N-type base layer, and the plurality of polysilicon lines may be a plurality of N-type polysilicon lines. In various other embodiments, the collector layer may be an N-type collector layer, the base layer may be a P-type base layer, and the plurality of polysilicon lines may be a plurality of P-type polysilicon lines.

In various embodiments, the apparatus comprises a plurality of bipolar junction transistor (BJT) cells. In some embodiments, the collector layer may be formed over a substrate, and at least one logic device may also be formed on the substrate. In various ones of these embodiments, at least one logic device may comprise a complementary metal oxide semiconductor device.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For purposes of this description, the phrase "NB" means A or B. The phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to high density, low base resistance bipolar junction transistor (BJT) arrays. Disclosed BJT arrays may find use in any number of applications including, for example, memory arrays. In various embodiments, a low base resistance BJT array may include a polysilicon layer on the base layer. Providing the polysilicon layer may accrue, relative to various prior art devices, a reduction in extrinsic base resistance and an enhancement of current gain beta.

Figure 1A:
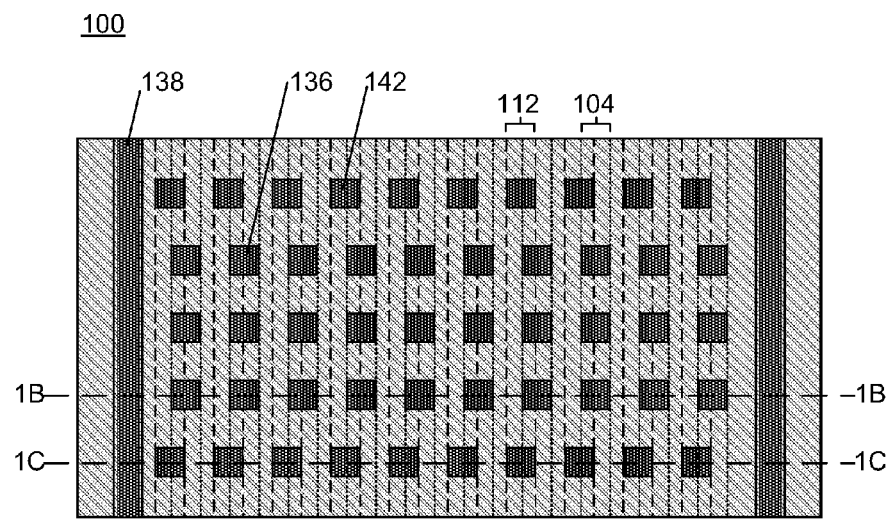
FIG. 1A illustrates a top view of an exemplary BJT device in accordance with various embodiments of the present invention.
Figure 1B:
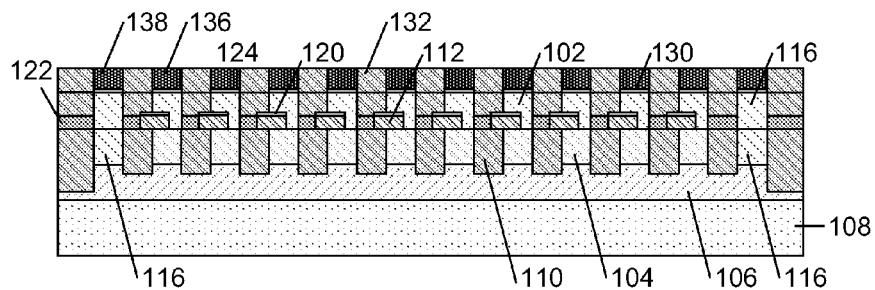
FIGS. 1B and 1C illustrate cross-sectional side views of the exemplary BJT device of FIG. 1A.
Figure 1C:
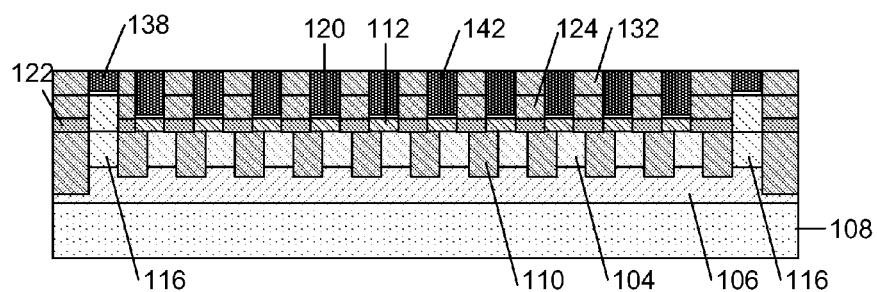

A top view of an exemplary BJT array 100 is illustrated at FIG. 1A, with cross-sectional side views of BJT array 100 illustrated at FIG. 1B and FIG. 1C. As illustrated, BJT array 100 includes a plurality of P+ emitters 102, an N− base layer 104, and a P+ collector 106 formed over a substrate 108. Emitters 102 are isolated by a plurality of isolation trench lines 110. A plurality of N+ polysilicon lines 112 are formed over base layer 104, each N+ polysilicon line 112 overlapping a portion of base layer 104 and an isolation trench line 110. In various embodiments, N+ polysilicon lines 112 may provide a low extrinsic base resistance while allowing base 104 itself to be lightly doped for achieving high current gain.

Although the illustrated embodiments generally depict the pnp configuration, various embodiments may take on an npn configuration. More particularly, in some embodiments, collector 106 may be an N-type collector layer, base layer 104 may be a P-type base layer, and plurality of polysilicon lines 112 may be a plurality of P-type polysilicon lines.

Figure 2A:
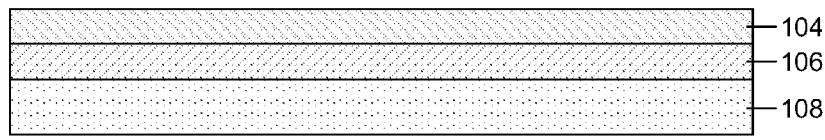
FIGS. 2A-2O illustrate cross-sectional views of a BJT device (such as, e.g., the BJT device illustrated in FIGS. 1A-1C) at various stages of a method in accordance with various embodiments of the present invention.
Figure 2B:
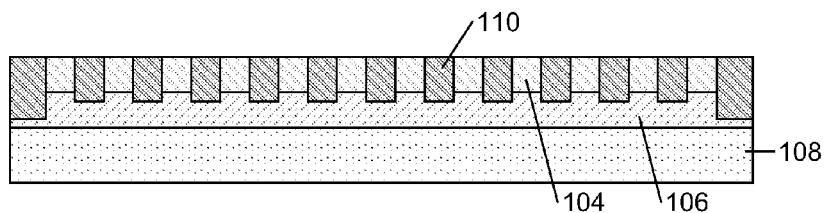
Figure 2C:
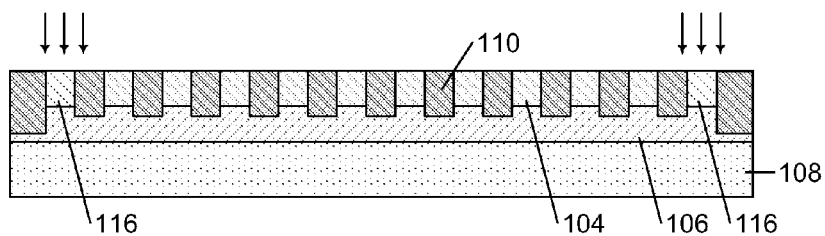
Figure 2D:
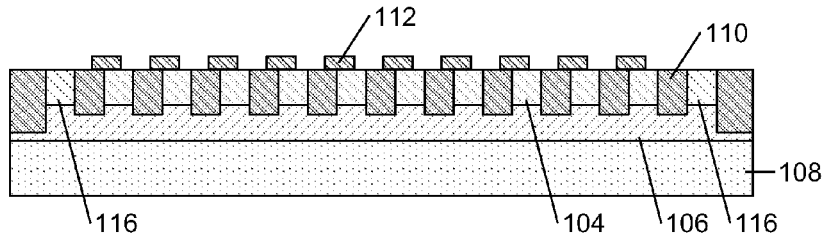
Figure 2E:
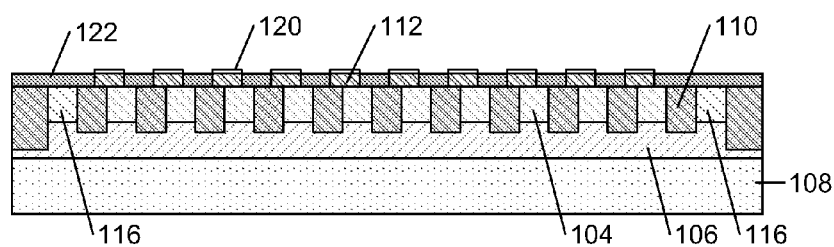
Figure 2F:
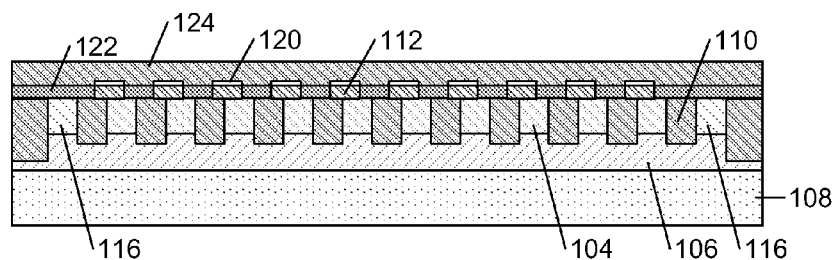
Figure 2G:
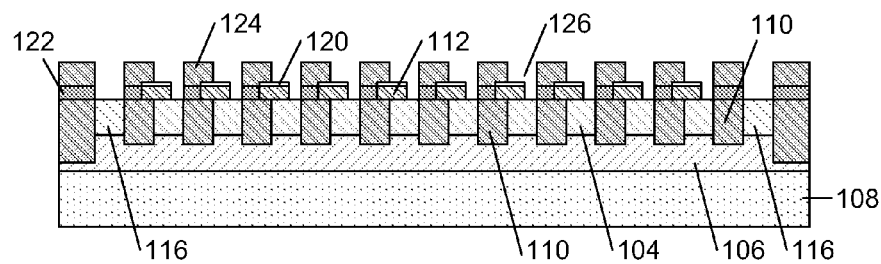
Figure 2H:
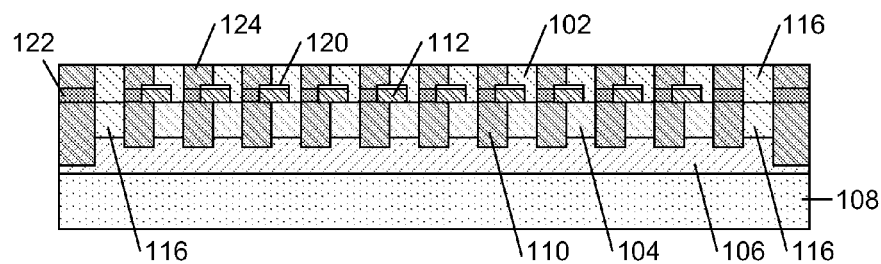
Figure 2I:
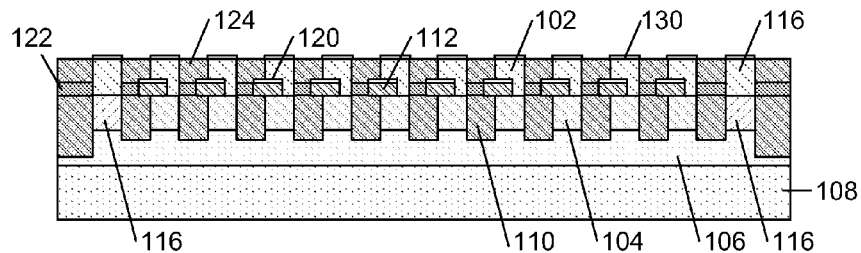
Figure 2J:
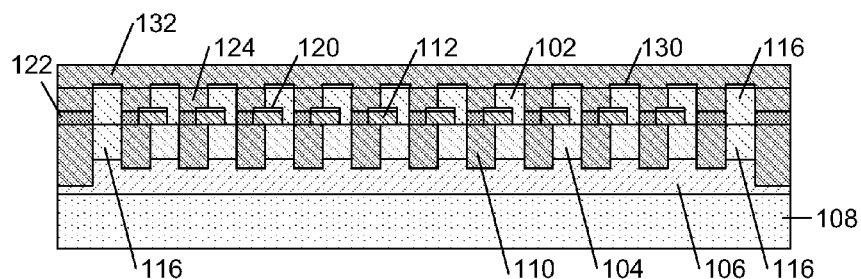
Figure 2K:
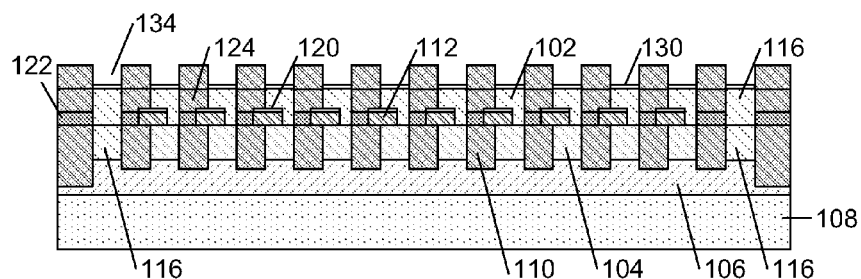
Figure 2L:
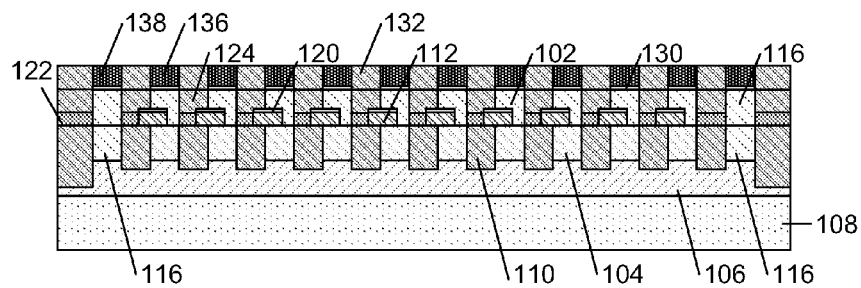
Figure 2M:
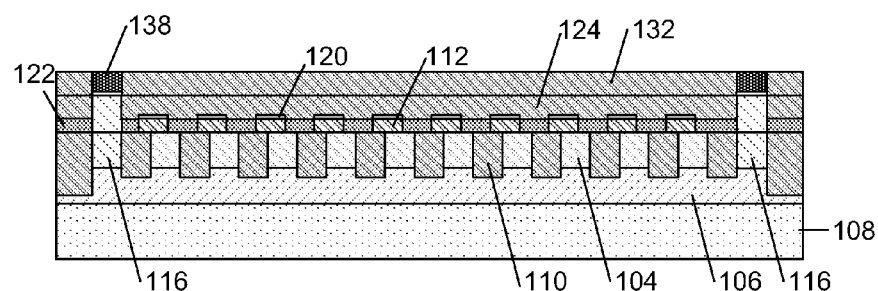
Figure 2N:
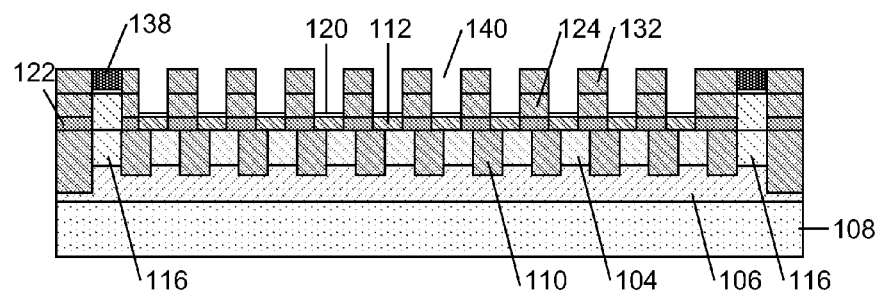
Figure 2O:
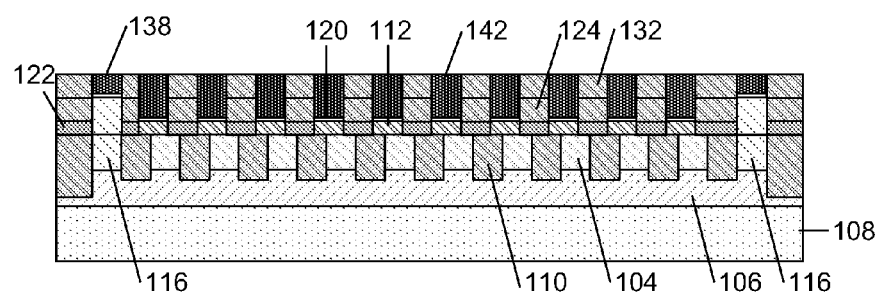

Various stages of an exemplary method for forming BJT array 100 are illustrated at FIGS. 2A-2O. For clarity, the same reference numerals used with respect to FIGS. 1A-1C are used in the discussion to follow with respect to FIGS. 2A-2O. Also, as noted herein, the various operations discussed and/or illustrated may be generally referred to as multiple discrete operations in turn to help in understanding embodiments of the present invention. The order of description should not be construed to imply that these operations are order dependent, unless explicitly stated. Moreover, some embodiments may include more or fewer operations than may be described.

Turning now to FIG. 2A, a substrate 108 may include a P+ collector layer 106 and an N− base layer 104. Substrate 108 may comprise silicon or another suitable material including, for example, gallium arsenide, gallium nitride, or indium phosphide. For forming collector layer 106, substrate 108 may be implanted with P+ ions. An epitaxial material may be formed over collector layer 106 and then implanted with N− ions for forming N− base layer 104. In some embodiments, the epitaxial material may be an in situ doped material, which may vitiate the need for subsequent implantation or may reduce the level of implantation required.

Although base layer 104 and collector layer 106 are illustrated as being co-extensive with substrate 108, in various other embodiments, a conventional lithographic operation may be enlisted. For example, a photoresist material or similar masking material/device may be used for forming desired patterns on substrate 108 by way of an exposure operation, and implanting the exposed areas of substrate 108 for forming collector layer 106. Similarly, a photoresist material or similar masking material/device may be used for forming desired patterns on collector layer 106, and forming base layer 104 in accordance with the pattern.

As illustrated at FIG. 2B, isolation trench lines 110 may be formed in base layer 104 and into portions of collector layer 106 for isolating a plurality of lines in base layer 104. Isolation trench lines 110 may comprise an oxide material or the like. In embodiments wherein BJT array 100 is included in a memory device, isolation trench lines 110 may be formed along a word line direction for forming corresponding lines of base layer 104 to be shared by a plurality of emitters (see, for example, emitters 102 illustrated at FIGS. 1A-1B). Collector layer 106 as illustrated is a common collector, shared among a plurality of base lines.

Collector pickups 116 may be formed as illustrated at FIG. 2C. Collector pickups 116 may be formed by implanting portions of base layer 104 with P+ ions. A lithographic operation may be enlisted for limiting implantation to those areas at which collector pickups 116 are desired. It should be noted that although in most cases it may be more desirable to perform the implant operation for forming collector pickups 116 after performing N− implantation of base layer 104, in some applications a P+ implant operation for forming collector pickups 116 may be performed prior to N− implantation of base layer 104.

A plurality of N+ polysilicon lines ("N+ lines) 112 may be formed over base layer 104 as illustrated at FIG. 2D. For forming N+ lines 112, an N+ polysilicon layer may be formed at least over base layer 104 and isolation trench lines 110, and the N+ polysilicon layer may be patterned to form N+ lines 112. The N+ polysilicon layer may be patterned by any method suitable for the purpose including, for example, a lithographic operation followed by an etch operation to remove the N+ polysilicon layer except at areas at which N+ lines 112 are to be formed.

It has been observed that the interface of N+ lines 112 and base layer 104 may be improved by a thermal treatment such as, for example, an anneal operation. The thermal treatment may drive some of the N+ dopants of N+ lines 112 into base layer 104 thereby enhancing the interface. In embodiments wherein lines 112 are P-type polysilicon and base layer 104 is a P-type material, the thermal treatment may drive some of the P+ dopants of lines 112 into base layer 104.

A nitride layer 122 may be formed as illustrated at FIG. 2E. A planarization operation may be performed for leveling nitride layer 122 and/or to expose top surfaces of N+ lines 112. A planaraization operation may include, for example, a chemical-mechanical plaranization (CMP) operation. In various embodiments, N+ lines 112 may be silicided to form a silicide layer 120. The silicidation may be self-aligned or non-self-aligned. Silicide layer 120 may further reduce the resistance of N+ lines 112. In some embodiments, silicidation of N+ lines 112 may be foregone.

An oxide layer 124 may be formed over nitride layer 122 and N+ lines 112 (FIG. 2F) and etched to form openings 126 (FIG. 2G). Openings 126 may correspond to locations at which emitters may be later formed. As illustrated, openings 126 expose base layer 104, collector pickups 116, and portions of N+ lines 112.

A polysilicon material may be deposited into openings 126 to form emitters 102 and for extending P+ collector pickups 116 as illustrated at FIG. 2H. As illustrated at FIG. 2H, a plurality of emitters 102 may be formed on the base layer 104, wherein at least a portion of one of the emitters (e.g., emitters 102) is formed on a portion of one of the polysilicon lines (e.g., N+ lines 112). As deposited, the polysilicon material may be undoped or in situ P+ doped material. A P+ implant operation may be performed for forming P+ emitters 102 and extended P+ collector pickups 116. In various embodiments, emitters 102 and/or collector pickups 116 may be silicided to form a silicide layer 130, as illustrated at FIG. 2I. The silicidation may be self-aligned or non-self-aligned, and in some embodiments, silicidation may be foregone altogether.

Emitters 102 and collector pickups 116 may be metallized as illustrated in FIGS. 2J-2L. As illustrated, an oxide layer 132 may be formed (FIG. 2J) and openings 134 formed therein (FIG. 2K). Openings 134 substantially correspond to locations at which emitters 102 and collector pickups 116 are located. Contacts 136, 138 may then be formed (FIG. 2L) in openings 134 by depositing an appropriate conductive material such as, for example, tungsten or the like. In various embodiments, contacts 138 to collector pickups 116 may be formed in a separate operation (i.e., either before or after formation of contacts 136 to emitters 102).

FIGS. 2G-2L illustrate cross-sectional views of BJT array 100 generally along the 1B-1B line of FIG. 1A, and illustrate an exemplary method of forming emitters 102 and collector pickups 116. FIGS. 2M-2O illustrate cross-sectional views of BJT array 100 generally along the 1C-1C line of FIG. 1A, and illustrate an exemplary method of forming contacts to N+ lines 112.

As illustrated at FIG. 2M, oxide layers 124, 132 are formed over N+ lines 112. Openings 140 are formed in oxide layers 124, 132 as illustrated at FIG. 2N. Contacts 142 may then be formed in openings 140 by depositing an appropriate conductive material such as, for example, tungsten or the like, as illustrated at FIG. 2O.

As illustrated at FIG. 2M, contacts 138 to collector pickups 116 have already been formed. In various embodiments, contacts 138 to collector pickups 116 may be formed during formation of contacts 136 to emitters 102 or may be formed in a separate operation, as mentioned above. In some embodiments, contacts 138 to collector pickups 116 may be formed during formation of contacts 142 to N+ lines 112.

Referring back to FIG. 2L, the interface of base 104 and emitters 102 are located relatively near N+ lines 112. In some embodiments, it may be desirable to have the interface of base 104 and emitters 102 located away from N+ lines 112. Locating the interface of base 104 and emitters 102 away from N+ lines 112 may result in less recombination of P+ ions (from emitters 102) and N+ ions (from N+ lines 112), which may result in current gain, beta, being increased. In some embodiments, moving the interface below N+ lines 112 by shortening base 104 may result in a shorter base transit time due at least in part to base 104 being narrower.

Figure 3A:
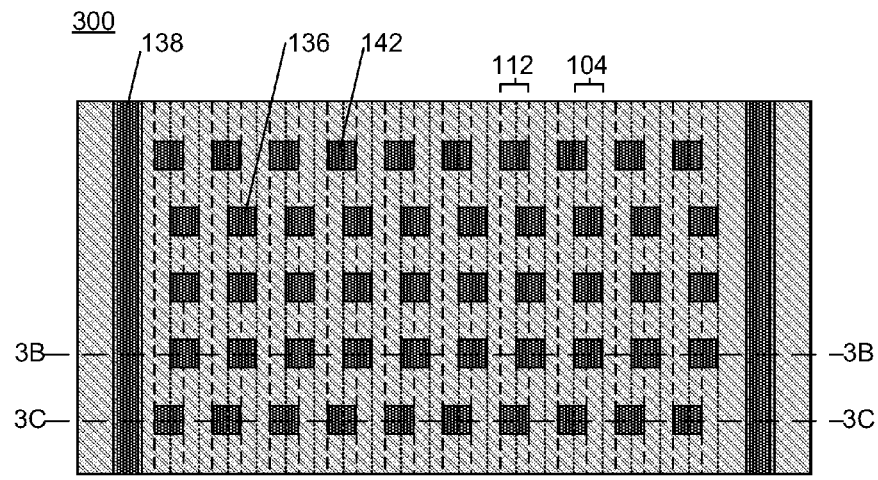
FIG. 3A illustrates a top view of another exemplary BJT device in accordance with various embodiments of the present invention.
Figure 3B:
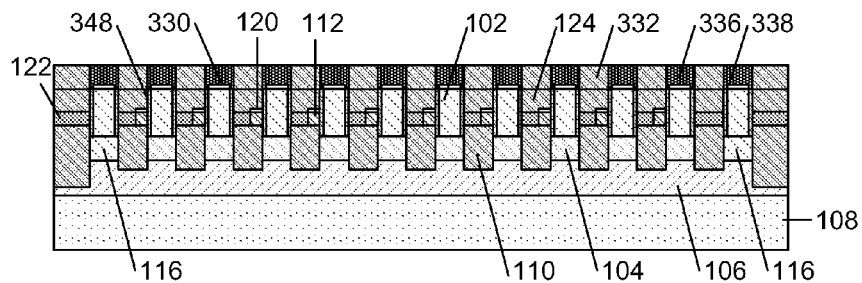
FIGS. 3B and 3C illustrate cross-sectional side views of the exemplary BJT device of FIG. 3A.
Figure 3C:
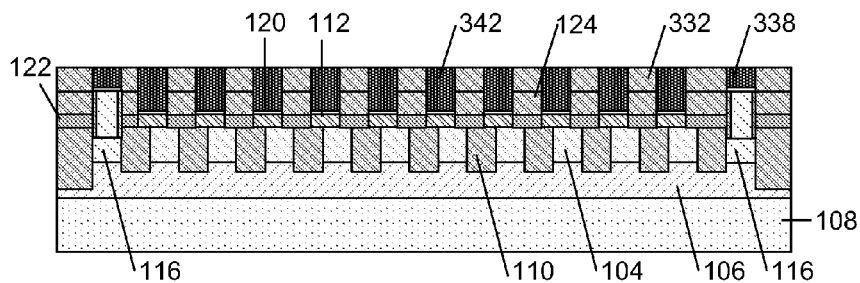

A top view of an exemplary BJT array 300 in which the interface of base 104 and emitters 102 is located away from N+ lines 112 is illustrated at FIG. 3A, with cross-sectional side views of BJT array 300 illustrated at FIG. 3B and FIG. 3C. As illustrated in FIG. 3B, the interface 344 of base 104 and emitters 102 is located away from N+ lines 112. More particularly, base 104 is recessed so that interface 344 of base 104 and emitters 102 is located below N+ lines 112. It should be noted that, for clarity, the same reference numerals used for various features of FIGS. 1A-1C and 2A-2O are used herein for similar features of FIGS. 3A-3C and 4A-4I.

Various stages of an exemplary method for locating interface 344 of base 104 and emitters 102 away from N+ lines 112 are illustrated at FIGS. 4A-4I. Various operations of the exemplary method for forming BJT array 100 described above with respect to FIGS. 2A-2O may be used for forming BJT array 300. The cross-sectional view illustrated at FIG. 4A, for example, may be formed by performing one or more operations of FIGS. 2A-2F and then etching through oxide layer 124, portions of N+ lines 112, and portions of base 104 to form openings 346.

Openings 346 may correspond to locations at which emitters 102 may be later formed. As illustrated, openings 346 expose base layer 104 and collector pickups 116.

Figure 4A:
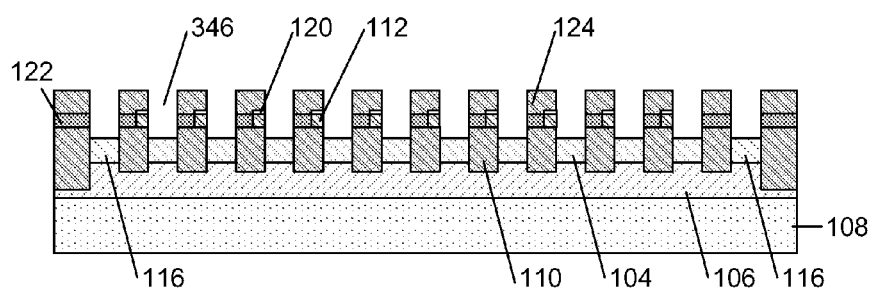
FIGS. 4A-4I illustrate cross-sectional views of a BJT device (such as, e.g., the BJT device illustrated in FIGS. 3A-3C) at various stages of a method in accordance with various embodiments of the present invention.
Figure 4B:
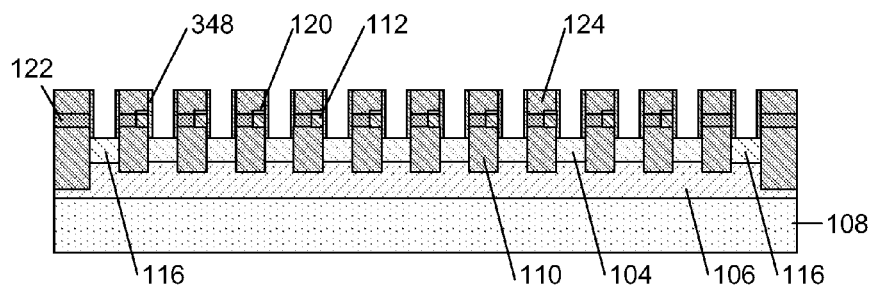

A layer of oxide 348 may be formed on sidewalls of openings 346 as illustrated at FIG. 4B. The sidewalls of openings 346 may be lined to isolate emitters 102 from N+ lines 112, thereby limiting recombination. Sidewall oxide 348 may be formed using any method suitable for the purpose. In some embodiments, a layer of thermal or conformal oxide may be formed and an anistropic etch performed to remove all oxide except oxide on the sidewalls of openings 346.

Figure 4C:
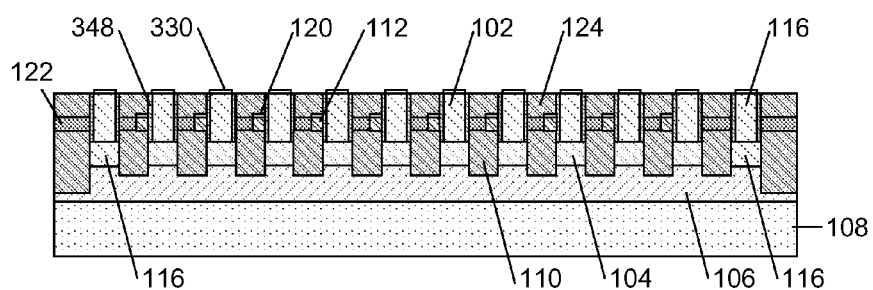

A polysilicon material may be deposited into openings 346 to form emitters 102 and for extending P+ collector pickups 116 as illustrated at FIG. 4C. As deposited, the polysilicon material may be undoped or in situ P+ doped material. A P+ implant operation may be performed for forming P+ emitters 102 and extended P+ collector pickups 116. In various embodiments, emitters 102 and/or collector pickups 116 may be silicided to form a silicide layer 330. The silicidation may be self-aligned or non-self-aligned, and in some embodiments, silicidation may be foregone altogether.

Figure 4D:
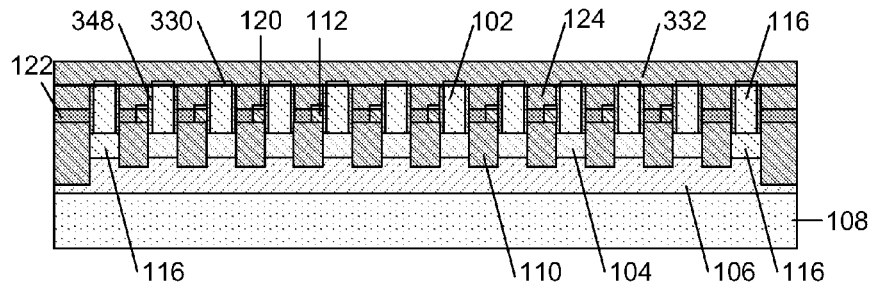
Figure 4E:
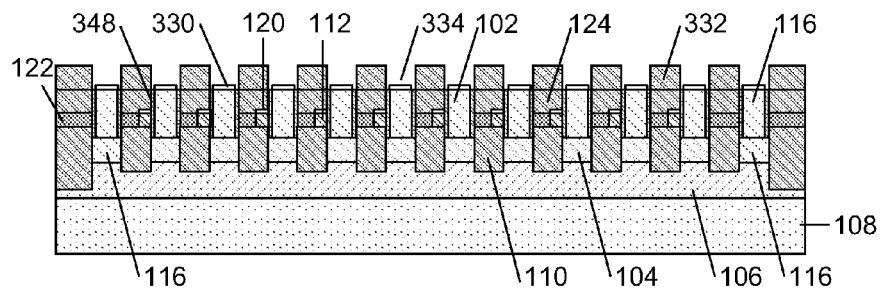
Figure 4F:
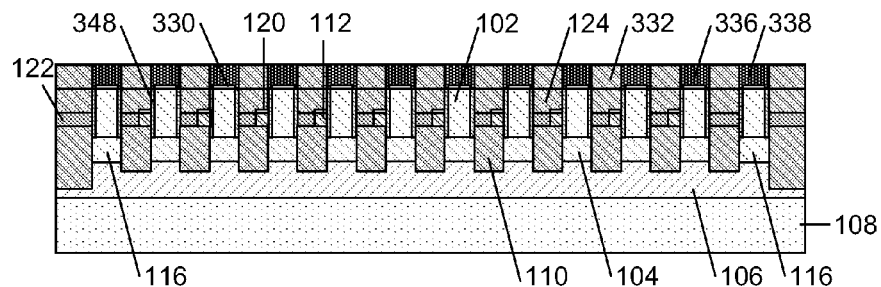

Emitters 102 and collector pickups 116 may be metallized as illustrated in FIGS. 4D-4F. As illustrated, an oxide layer 332 may be formed (FIG. 4D) and openings 334 formed therein (FIG. 4E). Openings 334 substantially correspond to locations at which emitters 102 and collector pickups 116 are located. Contacts 336, 338 may then be formed (FIG. 4F) in openings 334 by depositing an appropriate conductive material such as, for example, tungsten or the like. In various embodiments, contacts 336, 338 to collector pickups 116 may be formed in a separate operation (i.e., either before or after formation of contacts 336 to emitters 102).

Figure 4G:
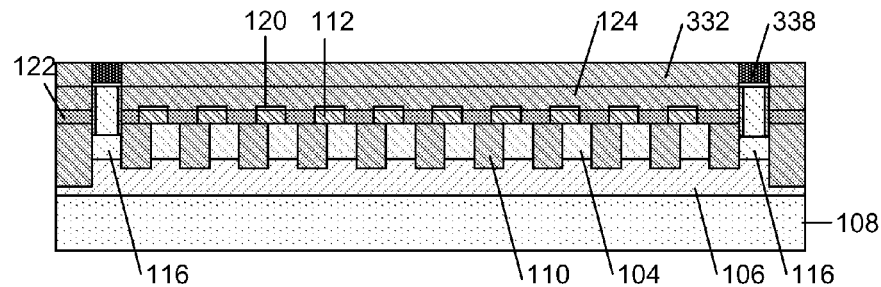
Figure 4H:
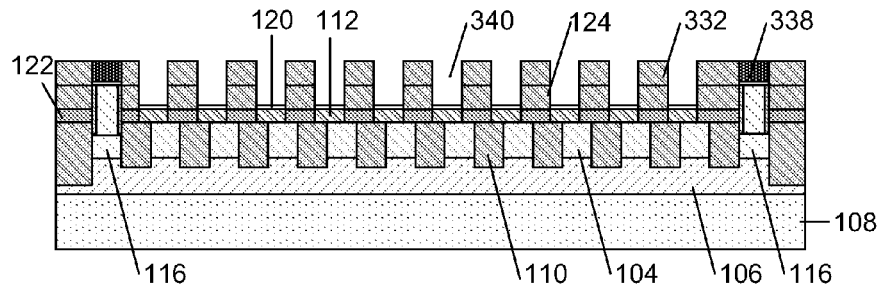
Figure 4I:
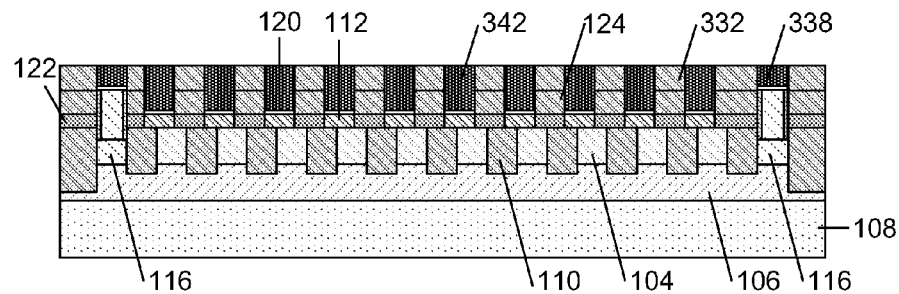

FIGS. 4E-4F illustrate cross-sectional views of BJT array 300 generally along the 3B-3B line of FIG. 3A, and illustrate an exemplary method of forming emitters 102 and collector pickups 116. FIGS. 4G-4I illustrate cross-sectional views of BJT array 300 generally along the 3C-3C line of FIG. 3A, and illustrate an exemplary method of forming contacts 342 to N+ lines 112.

As illustrated at FIG. 4G, oxide layers 124, 132 are formed over N+ lines 112. Openings 340 are formed in oxide layers 124, 132 as illustrated at FIG. 4H. Contacts 342 may then be formed in openings 340 (FIG. 4I) by depositing an appropriate conductive material such as, for example, tungsten or the like.

As illustrated at FIG. 4G, contacts 338 to collector pickups 116 have already been formed. In various embodiments, contacts 338 to collector pickups 116 may be formed during formation of contacts 336 to emitters 102 or may be formed in a separate operation, as mentioned above. In some embodiments, contacts 338 to collector pickups 116 may be formed during formation of contacts 342 to N+ lines 112.

According to various embodiments of the present invention, the base layer of a BJT array may be extended into portions of the isolation trench lines. To extend the base layer, an N– material may be formed into portions of the isolation trench lines, electrically connecting the base layer and at least one of the N+ polysilicon lines.

Figure 5A:
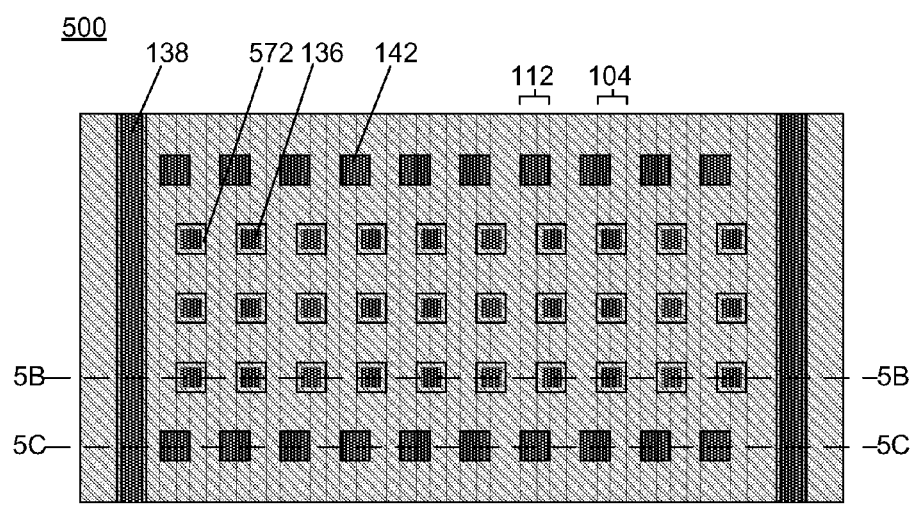
FIG. 5A illustrates a top view of another exemplary BJT device in accordance with various embodiments of the present invention.
Figure 5B:
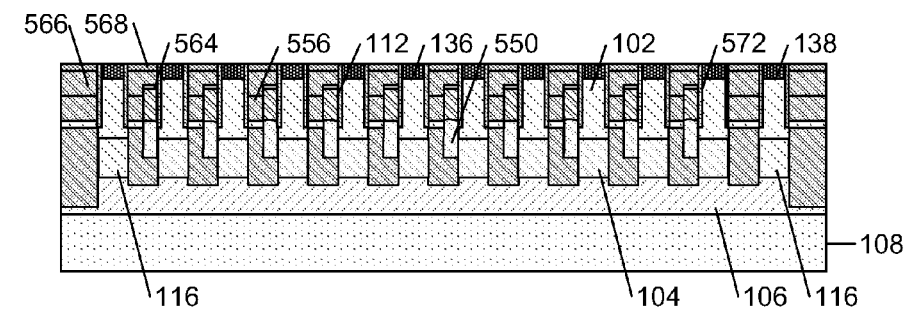
FIGS. 5B and 5C illustrate cross-sectional side views of the exemplary BJT device of FIG. 5A.
Figure 5C:
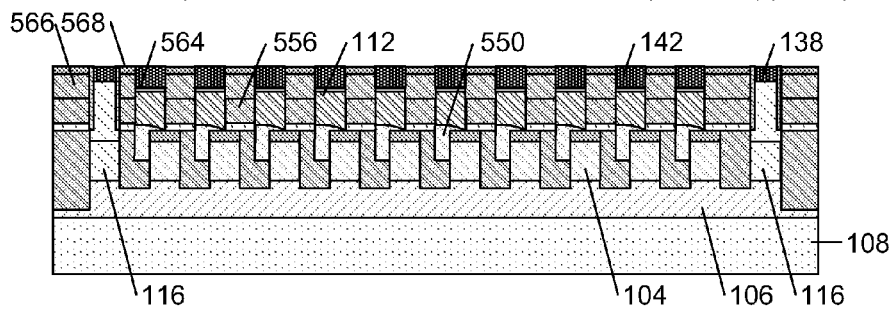

FIG. 5A, for example, is a top view of an exemplary BJT array 500 with cross-sectional side views of BJT array 500 illustrated at FIG. 5B and FIG. 5C. An N– material 550 may be formed in portions of isolation trench lines 110, and N+ lines 112 may be formed over base layer 104, each N+ line 112 overlapping a portion of base layer 104 and an isolation trench line 110 including N– material 550 therein.

It should be noted that BJT array 500 includes some similar features of BJT arrays 100 and 300 discussed herein, and for clarity, the same reference numerals used for various features of FIGS. 1A-1C, 2A-2O, 3A-3C, and 4A-4I are used herein for similar features of FIGS. 5A-5C and 6A-6N. Further, various operations of the exemplary methods for forming BJT array 100 and 300 described above may be used for forming BJT array 300.

Figure 6A:
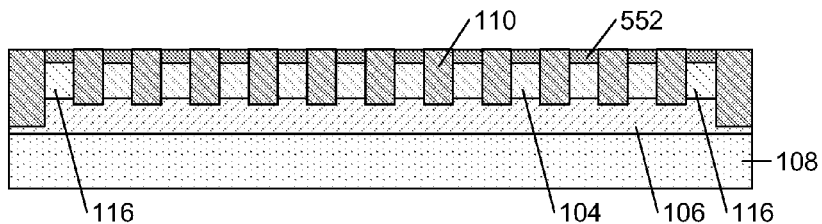
FIGS. 6A-6N illustrate cross-sectional views of a BJT device (such as, e.g., the BJT device illustrated in FIGS. 5A-5C) at various stages of a method in accordance with various embodiments of the present invention.
Figure 6B:
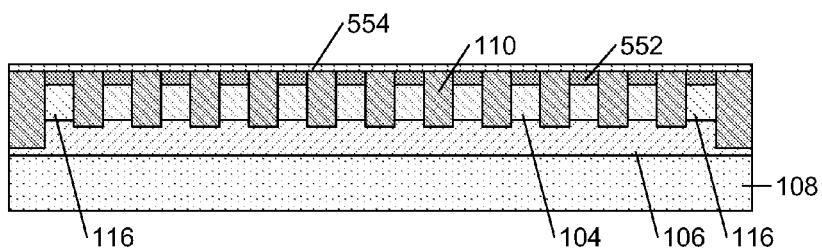
Figure 6C:
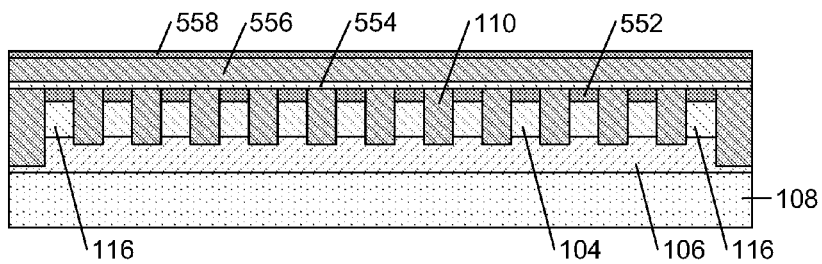
Figure 6D:
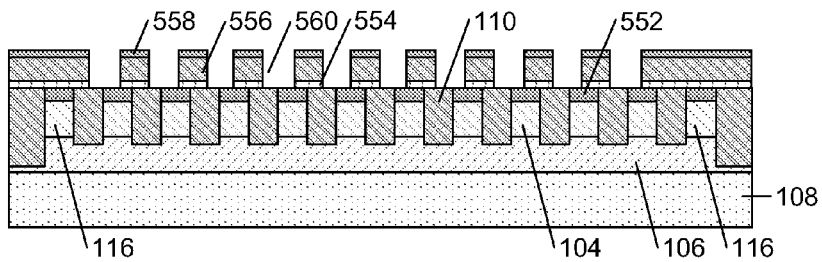
Figure 6E:
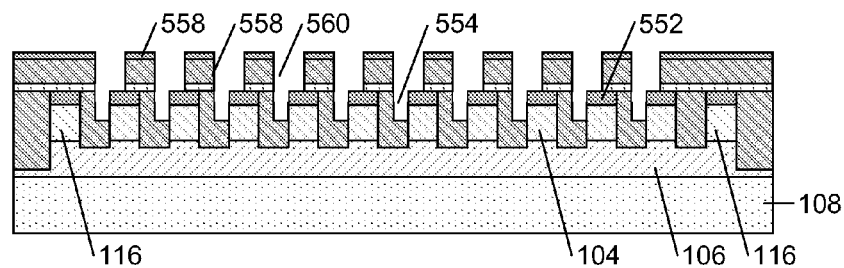
Figure 6F:
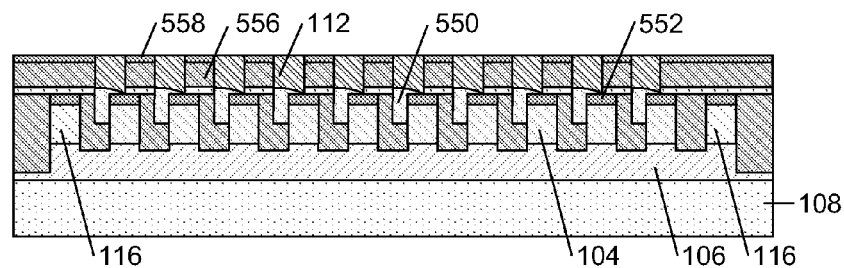
Figure 6G:
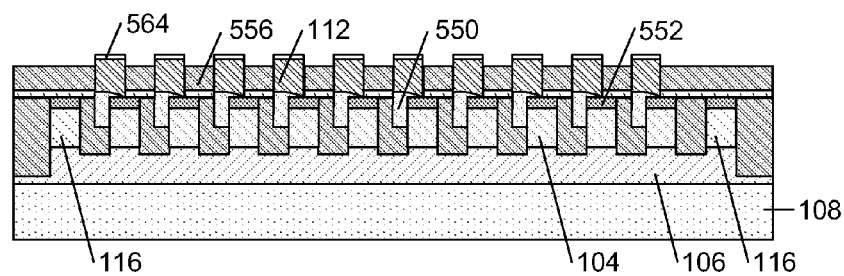
Figure 6H:
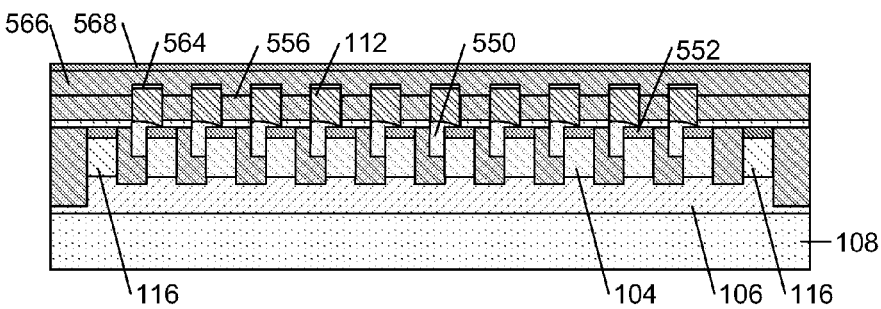
Figure 6I:
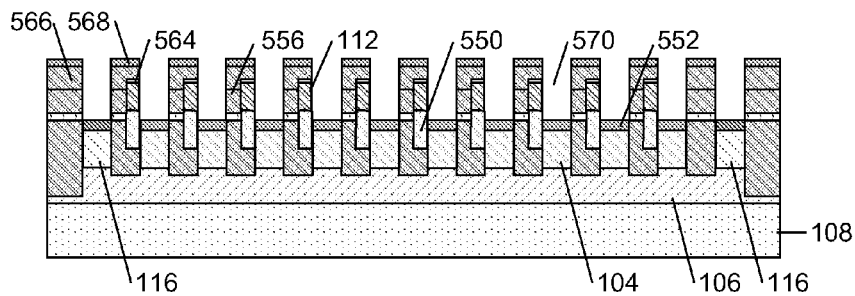
Figure 6J:
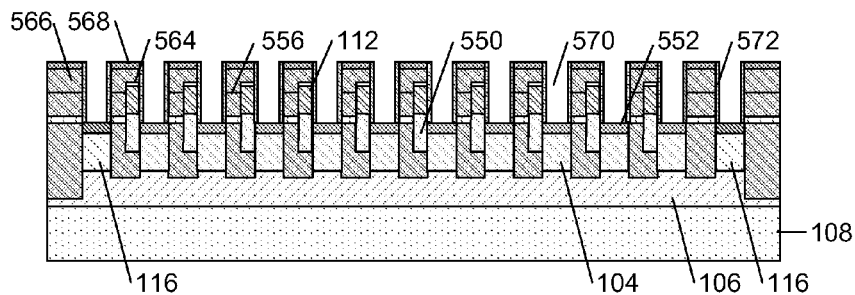
Figure 6K:
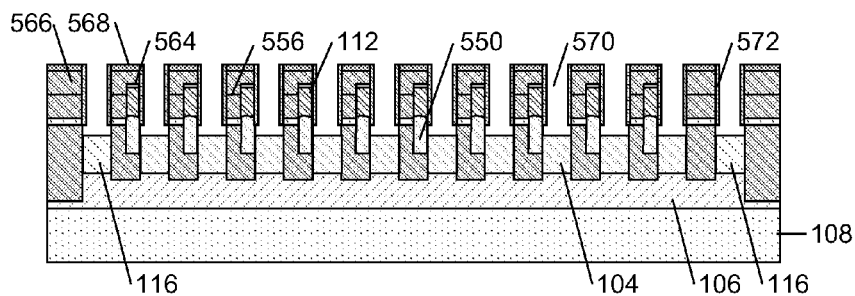
Figure 6L:
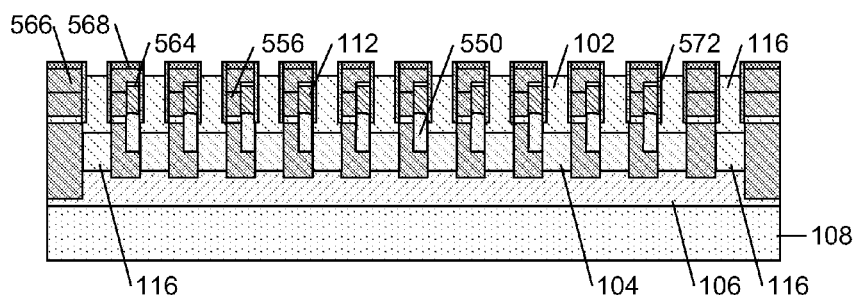
Figure 6M:
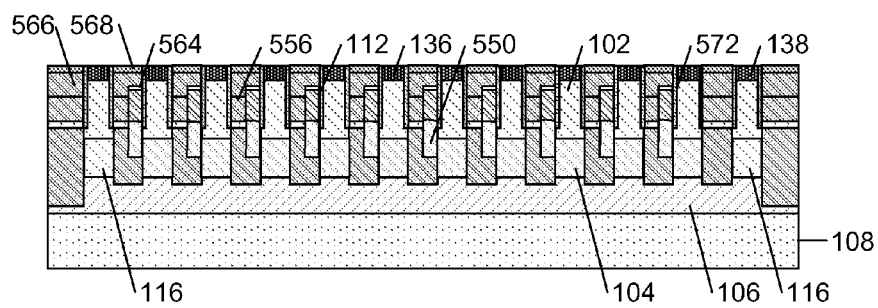
Figure 6N:
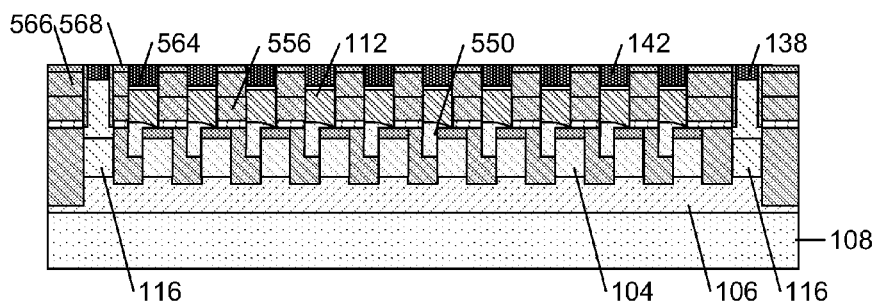

Various stages of an exemplary method for forming BJT array 500 are illustrated at FIGS. 6A-6N. FIGS. 6A-6M illustrate cross-sectional views of BJT array 500 generally along the 5B-5B line of FIG. 5A, and illustrate an exemplary method of forming emitters 102 and collector pickups 116. FIG. 6N illustrates a cross-sectional view of BJT array 500 generally along the 5C-5C line of FIG. 5A.

As illustrated at FIG. 6A, a nitride layer 552 may be formed over base layer 104 and collector pickups 116. In some embodiments, an oxide layer (not illustrated) may be formed on base layer 104 prior to forming nitride layer 552. Such an oxide layer may be desirable for providing an improved interface between nitride layer 552 and base layer 104 and may provide stress-relieving characteristics at least in terms of thermal expansion differences between nitride layer 552 and base layer 104.

As illustrated, isolation trench lines 110 are substantially level with nitride layer 552. In various embodiments, isolation trench lines 110 may be formed and then leveled with nitride layer 552. In various embodiments, a CMP operation or other planarization operation may be performed for the leveling.

An etch stop layer 554 may be formed over isolation trench lines 110 and nitride layer 552 as illustrated at FIG. 6B. Any suitable material may be used for forming etch stop layer 554. In some embodiments, etch stop layer 554 may be omitted.

As illustrated at FIG. 6C, an oxide layer 556 may be formed over etch stop layer 554. In some embodiments, a hardmask 558 may be formed over oxide layer 556 (FIG. 6D) for protecting oxide layer 556 from undesired etching during subsequent operations. A photoresist material may be used instead of hardmask 558 and may depend at least in part on the extent of etching to be performed.

Openings 560 may be formed in etch stop layer 554, oxide layer 556, and hardmask 558 as illustrated at FIG. 6D. The locations of openings 560 may correspond to the desired locations of N+ lines 112 to be formed. In any event, openings 560 may be configured to allow N+ lines 112 to overlap isolation trench lines 110 and portions of base layer 104.

Portions of isolation trench lines 110 may be etched to form openings 562 (FIG. 6E) into which N– material 550 may be deposited (FIG. 6F). N– material 550 may comprise an N– epitaxial material. N– material 550 may be in electrical contact with base layer 104 for providing an extended region of base layer 104. Over N– material 550, N+ lines 112 may be formed. N+ lines 112 generally overlap base layer 104 and isolation trench lines 110, having N– material 550 formed therein.

In various embodiments, N+ lines 112 may be silicided to form a silicide layer 564 as illustrated at FIG. 6G. The silicidation may be self-aligned or non-self-aligned. Silicide layer 564 may further reduce the resistance of N+ lines 112. In some embodiments, silicidation of N+ lines 112 may be foregone.

After formation of openings 560, 562, hardmask 558 may be removed (FIG. 6G) and another oxide layer 566 may be formed over oxide layer 556 (FIG. 6H). In some embodiments, hardmask 558 may be left intact, with oxide layer 566 being formed over hardmask 558. Another hardmask 568 may be formed over oxide layer 566 for protecting oxide layer 566 from undesired etching during subsequent operations. A photoresist material may be used instead of hardmask 568 and may depend at least in part on the extent of etching to be performed.

Openings 570 may be formed in oxide layers 556, 566, and hardmask 568 as illustrated at FIG. 6I. The locations of openings 570 may correspond to the desired locations of emitters 102 to be formed. In any event, openings 570 may be configured to form to allow emitters 102 to be formed substantially over base layer 104.

A layer of oxide 572 may be formed on sidewalls of openings 570 as illustrated at FIG. 6J. The sidewalls of openings 570 may be lined to isolate emitters 102 from N+ lines 112, thereby limiting recombination. Sidewall oxide 572 may be formed using any method suitable for the purpose. For example, in some embodiments, a layer of thermal or conformal oxide may be formed and an anistropic etch performed to remove all oxide except oxide on the sidewalls of openings 570.

After forming oxide 572 on sidewalls of openings 570, portions of nitride layer 552 may be exposed at bottoms of openings 570 as illustrated at FIG. 6J. The portions of nitride layer 552 may be removed to expose base layers 104 and collector pickups 116 as illustrated at FIG. 6K.

For forming emitters 102 and extending P+ collector pickups 116, a polysilicon material may be deposited into openings 570 as illustrated at FIG. 6L. As deposited, the polysilicon material may be undoped or in situ P+ doped material. A P+ implant operation may be performed for forming P+ emitters 102 and extended P+ collector pickups 116. In various embodiments, emitters 102 and/or collector pickups 116 may be silicided to form a silicide layer (not illustrated). The silicidation may be self-aligned or non-self-aligned, and in some embodiments, silicidation may be foregone altogether.

Emitters 102 and collector pickups 116 may be metallized as illustrated at FIG. 6M. Contacts 136, 138 may be formed by depositing onto emitters 102 and collector pickups 116, respectively, an appropriate conductive material. A suitable conductive material may comprise, for example, tungsten or the like. In various embodiments, contacts 138 to collector pickups 116 may be formed in a separate operation (i.e., either before or after formation of contacts 136 to emitters 102).

As illustrated at FIGS. 6L-6M, emitters 102 are recessed. Recessing emitters 102 may allow for self-alignment of contacts 136, 138 during metallization. Emitters 102 may be recessed using any method suitable for the purpose including, for example, depositing polysilicon into openings 570 and then etching back to form recesses.

N+ lines 112 may be similarly metallized. As illustrated at FIG. 6N, contacts 142 may be formed on N+ lines 112. Contacts 142 may be formed using any suitable conductive material such as, for example, tungsten or the like.

As noted above, a BJT array in accordance with various embodiments of the present invention may used for forming a memory device including, for example, a phase change memory device. In various embodiments, a substrate onto which a BJT array is formed may also include at least one logic device formed thereon. A logic device may comprise, for example, a complementary metal oxide semiconductor (CMOS) device.

Various stages of an exemplary method for forming a memory device including a BJT array and at least one logic device is illustrated at FIGS. 7A-7E. At FIG. 7A, a BJT array has already been formed over substrate 108 and logic area 774 may used for forming at least one logic device. The illustrated BJT array may comprise a BJT array formed using various methods described herein such as, for example, BJT array 100, 300, or 500. For the illustrated embodiment, substrate 108 includes BJT array 500 formed thereover as described above with reference to FIGS. 5A-5C and 6A-6N.

Figure 7A:
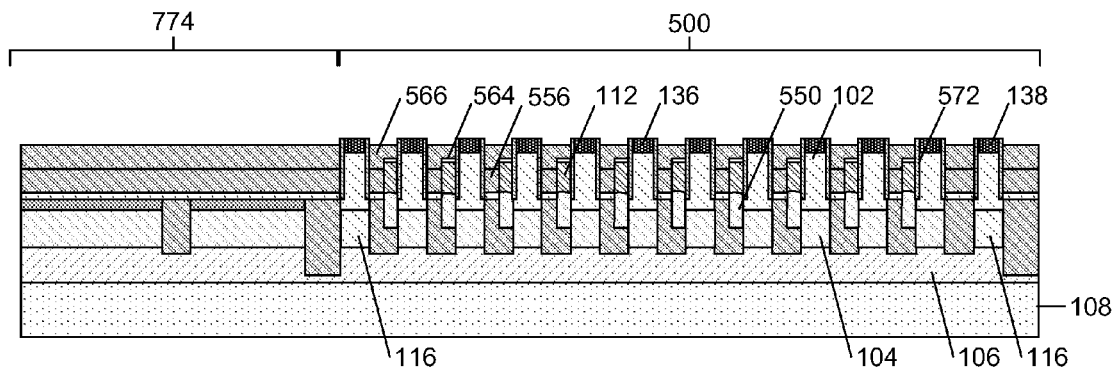
FIGS. 7A-7E illustrate cross-sectional side views of an exemplary memory device in accordance with various embodiments of the present invention.
Figure 7B:
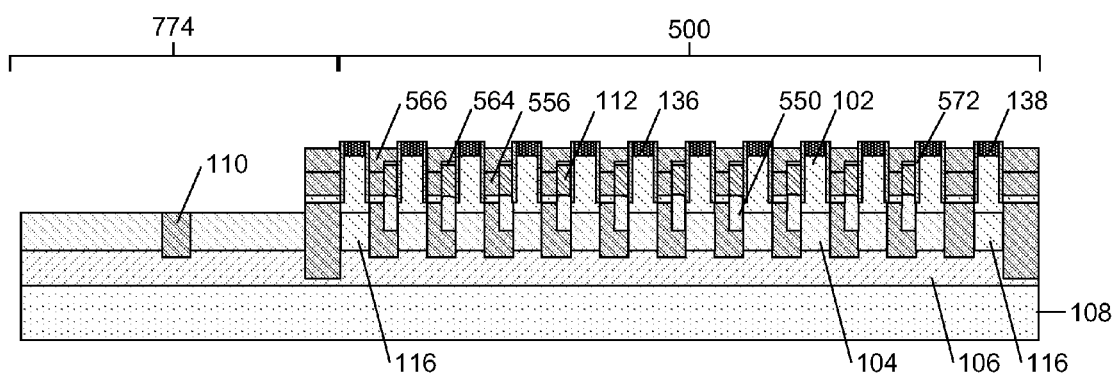

As illustrated at FIG. 7B, oxide layers 556, 566, etch stop layer 554, and nitride layer 552 are removed over logic area 774. In various embodiments, logic area 774 may include at least one trench isolation line 110 for isolating logic devices.

Figure 7C:
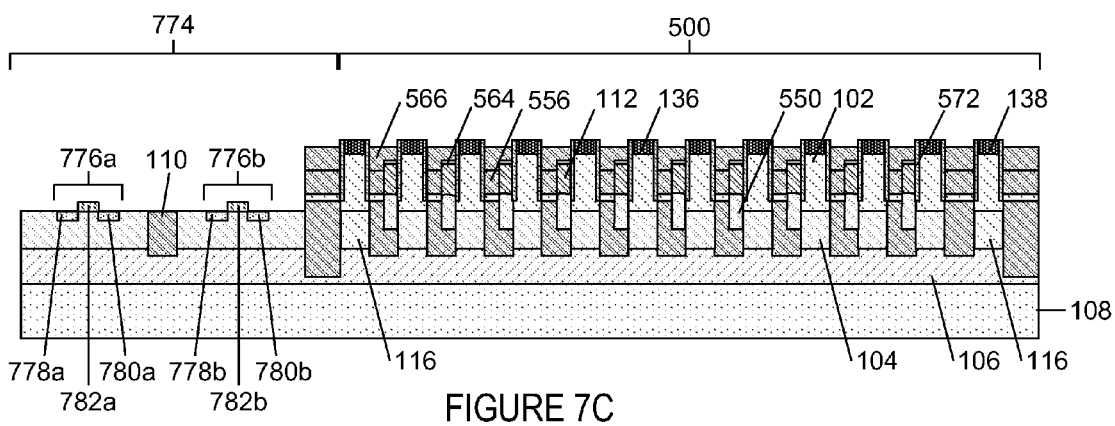

Logic devices 776a, 776b may be formed in logic area 774 as illustrated at FIG. 7C. In the illustrated embodiments, logic devices 776a, 776b comprise CMOS devices including source 778a, drain 780a, and gate 782a, and source 778b, drain 780b, and gate 782b, respectively.

Figure 7D:
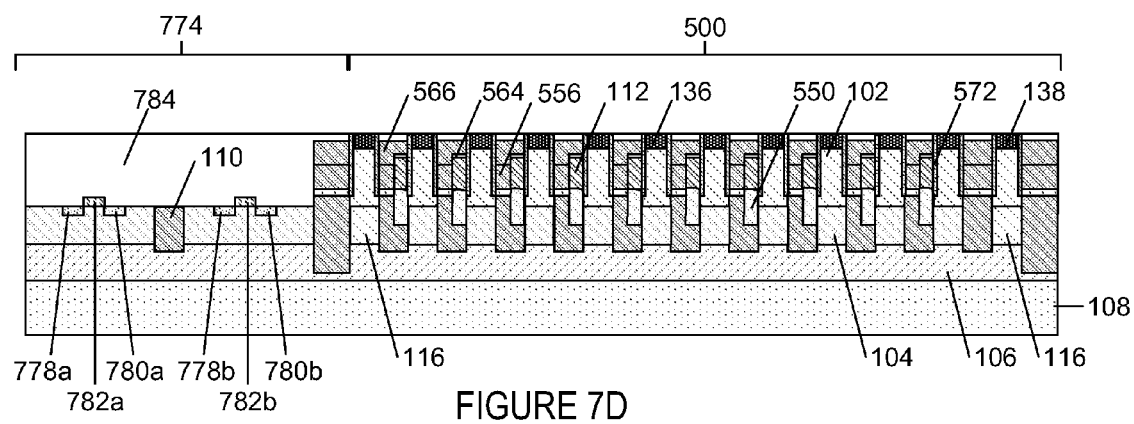

After formation of logic devices 776a, 776b, a dielectric layer 784 may be formed over logic area 774 and BJT array 500 as illustrated at FIG. 7D. As illustrated, dielectric layer 784 is substantially level with tops of contacts 136, 138. As deposited, however, dielectric layer 784 may not initially be level, with a global height above BJT array 500 being higher than that over logic area 774 due at least in part to the differing heights of BJT array 500 and logic devices 776a, 776b. Accordingly, in various embodiments, a multi-step etch operation may be used in which logic area 774 is masked and dielectric layer 684 over BJT array 500 selectively etched to a level substantially even with dielectric layer 784 over logic area 774. Dielectric layer 684 may then be planarized (CMP, for example) to achieve global levelness.

Figure 7E:
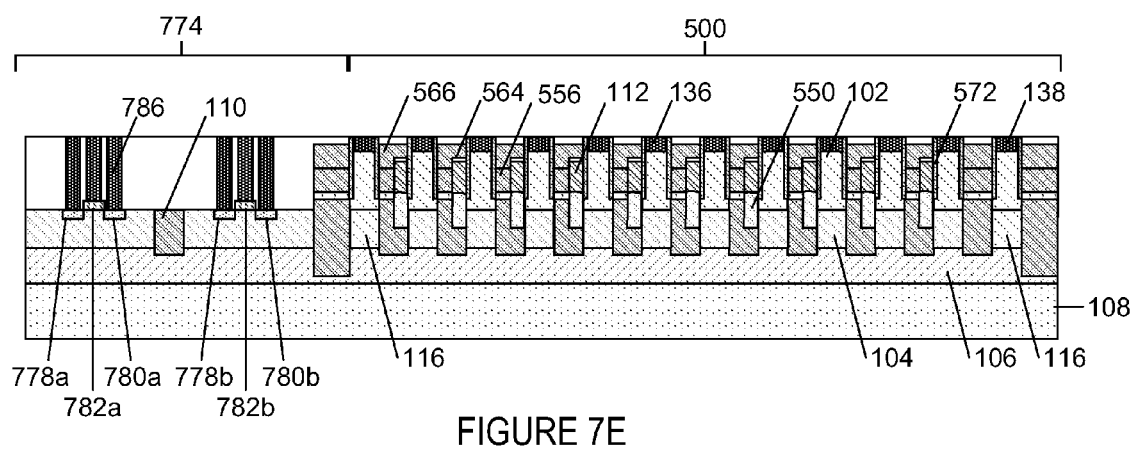

A metallization operation may be performed as illustrated at FIG. 7E for forming contacts 786 to logic devices 776a, 776b. Contacts 786 may be formed using any conductive material suitable for purpose including, for example, tungsten.

It should be noted that although BJT array 500 is illustrated as substantially formed prior to forming logic devices 776a, 776b, in various other embodiments logic devices 776a, 776b may be formed at any suitable point in the overall method for forming a memory device. For example, in various embodiments, logic devices may be formed after forming isolation trench lines 110 but prior to forming BJT array 500. In other embodiments, logic devices 776a, 776b may be formed after formation of emitters 102 but prior to formation of contacts 136, 138.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
a collector layer;
a base layer formed on the collector layer;
a plurality of isolation trench lines formed in the base layer and extending into the collector layer;
a plurality of polysilicon lines formed on the base layer, the plurality of polysilicon lines overlapping the plurality of isolation trench lines; and
a plurality of emitters formed on the base layer, wherein at least a portion of one of the plurality of emitters is formed on a portion of one of the plurality of polysilicon lines.

2. The apparatus of claim 1, further comprising a silicide layer formed on one or more of the plurality of emitters.

3. The apparatus of claim 1, wherein the collector layer is a P-type collector layer, the base layer is an N-type base layer, and the plurality of polysilicon lines are a plurality of N-type polysilicon lines.

4. The apparatus of claim 1, wherein the collector layer is an N-type collector layer, the base layer is a P-type base layer, and the plurality of polysilicon lines are a plurality of P-type polysilicon lines.

5. The apparatus of claim 1, wherein the plurality of isolation trench lines comprise an oxide material.

6. The apparatus of claim 1, further comprising a silicide layer formed on one or more of the plurality of polysilicon lines.

7. The apparatus of claim 1, wherein the apparatus comprises a plurality of bipolar junction transistor (BJT) cells.

8. A method comprising:
forming a base layer on a collector layer;
forming a plurality of isolation trench lines in the base layer, the plurality of isolation trench lines extending into the collector layer;
forming a plurality of polysilicon lines on the base layer, the plurality of polysilicon lines overlapping the plurality of isolation trench lines; and
forming a plurality of emitters on the base layer, wherein at least a portion of one of the plurality of emitters is formed on a portion of one of the plurality of polysilicon lines.

9. The method of claim 8, further comprising performing an anneal operation to drive dopants of the plurality of polysilicon lines into the base layer.

10. The method of claim 8, further comprising forming a silicide layer on one or more of the plurality of emitters.

11. The method of claim 8, wherein said forming the plurality of emitters includes forming at least one sidewall oxide layer to physically isolate at least one of the plurality of emitters from at least one of the plurality of polysilicon lines.

12. The method of claim 8, wherein the collector layer is a P-type collector layer, the base layer is an N-type base layer, and the plurality of polysilicon lines are a plurality of N-type polysilicon lines.

13. The method of claim 8, wherein the collector layer is an N-type collector layer, the base layer is a P-type base layer, and the plurality of polysilicon lines are a plurality of P-type polysilicon lines.

14. The method of claim 8, wherein the plurality of isolation trench lines comprise an oxide material.

15. The method of claim 8, further comprising forming a silicide layer on one or more of the plurality of polysilicon lines.

* * * * *